(12) United States Patent
Wieland et al.

(10) Patent No.: US 8,995,133 B2
(45) Date of Patent: Mar. 31, 2015

(54) ELECTRICAL CONNECTION ASSEMBLY

(71) Applicant: Deere & Company, Moline, IL (US)

(72) Inventors: Andrew D. Wieland, Fargo, ND (US);
Kevin B. Larsen, Rosholt, SD (US);
John N. Oenick, Fargo, ND (US);
Gregory K. Harmelink, Moorhead, MN (US); Neal D. Clements, Fargo, ND (US)

(73) Assignee: Deere & Company, Moline, IL (US)

( * ) Notice: Subject to any disclaimer, the term of this patent is extended or adjusted under 35 U.S.C. 154(b) by 182 days.

(21) Appl. No.: 13/664,514

(22) Filed: Oct. 31, 2012

(65) Prior Publication Data

US 2014/0118950 A1 May 1, 2014

(51) Int. Cl.
H05K 7/20 (2006.01)

(52) U.S. Cl.
CPC .................. H05K 7/20927 (2013.01)
USPC ...... 361/713; 361/676; 361/679.54; 361/831; 363/141; 439/487

(58) Field of Classification Search
USPC ................. 361/622, 627, 633, 637, 648, 659, 361/668–669, 675–678, 679.46, 679.54, 361/688, 704, 707, 709–710, 713, 730, 752, 361/831
See application file for complete search history.

(56) References Cited

U.S. PATENT DOCUMENTS

| | | | |
|---|---|---|---|
| 6,280,206 B1 | 8/2001 | Kuroda et al. | |
| 6,529,394 B1* | 3/2003 | Joseph et al. | 363/141 |
| 7,903,417 B2* | 3/2011 | Stahlhut et al. | 361/713 |
| 2006/0092611 A1* | 5/2006 | Beihoff et al. | 361/698 |
| 2009/0023345 A1 | 1/2009 | Matsumoto et al. | |
| 2009/0255727 A1 | 10/2009 | Tarchinski | |
| 2010/0025126 A1 | 2/2010 | Nakatsu et al. | |

FOREIGN PATENT DOCUMENTS

| | | |
|---|---|---|
| DE | 10233279 A1 | 2/2004 |
| JP | 2004056924 | 2/2004 |
| KR | 20060114642 | 11/2006 |
| KR | 20110001753 U | 2/2011 |
| WO | 2012059831 A1 | 5/2012 |

OTHER PUBLICATIONS

Jaiswal et at. Thermal Interface Materials used for Improving the Efficiency and Power Handling Capability of Electronic Devices: A Review. International Journal of Innovative Technology & Creative Engineering (ISSN:2045-8711): vol. 1 No. 5 May 2011 retrieved from the Internet. Retrieved on [Feb. 23, 2014] <URL: http://ijitce.co.ukldownload/May/IJITCE_May 3.pdf.

(Continued)

Primary Examiner — Courtney Smith

(57) ABSTRACT

An electrical connection assembly includes a metal housing and an electrical module having a plurality of electrical components mounted on a component base. The base is supported on the housing. A socket conducts electrical current from a pin of a cable to the electrical components. A heat sink member conducts heat directly from the socket to the metal housing. An electrically insulating thermally conducting pad is positioned between the housing and an end of the heat sink member. A current sensor has a cylindrical body which surrounds a portion of the socket.

5 Claims, 3 Drawing Sheets

(56) References Cited

OTHER PUBLICATIONS

International Search Report dated Mar. 18, 2014.
John Deere, John Deere Inverter, photographs of production unit (4 pages), date unknown but believed to be commercially available before invention of present invention.

Rinehart Motion Systems, inverter unit, photographs of production unit (2 pages), date unknown but believed to be commercially available before invention of present invention.
Semikron, inverter unit, photographs of production unit (2 pages), date unknown but believed to be commercially available before invention of present invention.

* cited by examiner

ELECTRICAL CONNECTION ASSEMBLY

FIELD

The present disclosure relates to an electrical connection assembly, such as for a power inverter.

BACKGROUND

A connection assembly is needed to electrically connect an electrical cable to an electrical unit or module, such as the power module of an inverter. The connection assembly needs to be environmentally sealed, electromagnetically shielded, include accommodations for a current sensing device, and protect the internal electronic components of the inverter from damage during installation. Generally, a number of separate components and compartments are used to accomplish this type of connection. The proposed invention meets these requirements, and limits the number of separate components thus simplifying the assembly process, shortening assembly time, and reducing cost and size of a typical connection system.

In a typical inverter connection assembly, a cable is fed through a hole in the housing wall and the cable connection is made in an access area. That access area requires a separate cover to seal and protect the user when the inverter is powered. Also, these connections do not incorporate a current sensor. Such assemblies include heat sinks which cool the power module. But, the heat sink does not directly engage the power connection. Other known inverter power connectors are large and costly, and do not include a current sensor in the connector assembly.

SUMMARY

According to an aspect of the present disclosure, an electrical assembly includes a metal housing and an electrical module. The housing has a cooling passage formed therein. The electrical module has a plurality of electrical components mounted on a component base. The base is supported on the housing. A socket receives a male pin of a cable and conducts electrical current from the cable to the electrical components. A heat sink member conducts heat directly from the socket to the metal housing. The heat sink member has a first end positioned between the socket and a portion of the base. An electrically insulating thermally conducting pad is positioned between the housing and a second end of the heat sink member. A current sensor has a cylindrical body which surrounds a portion of the socket.

DETAILED DESCRIPTION OF THE DRAWINGS

Figure 1:
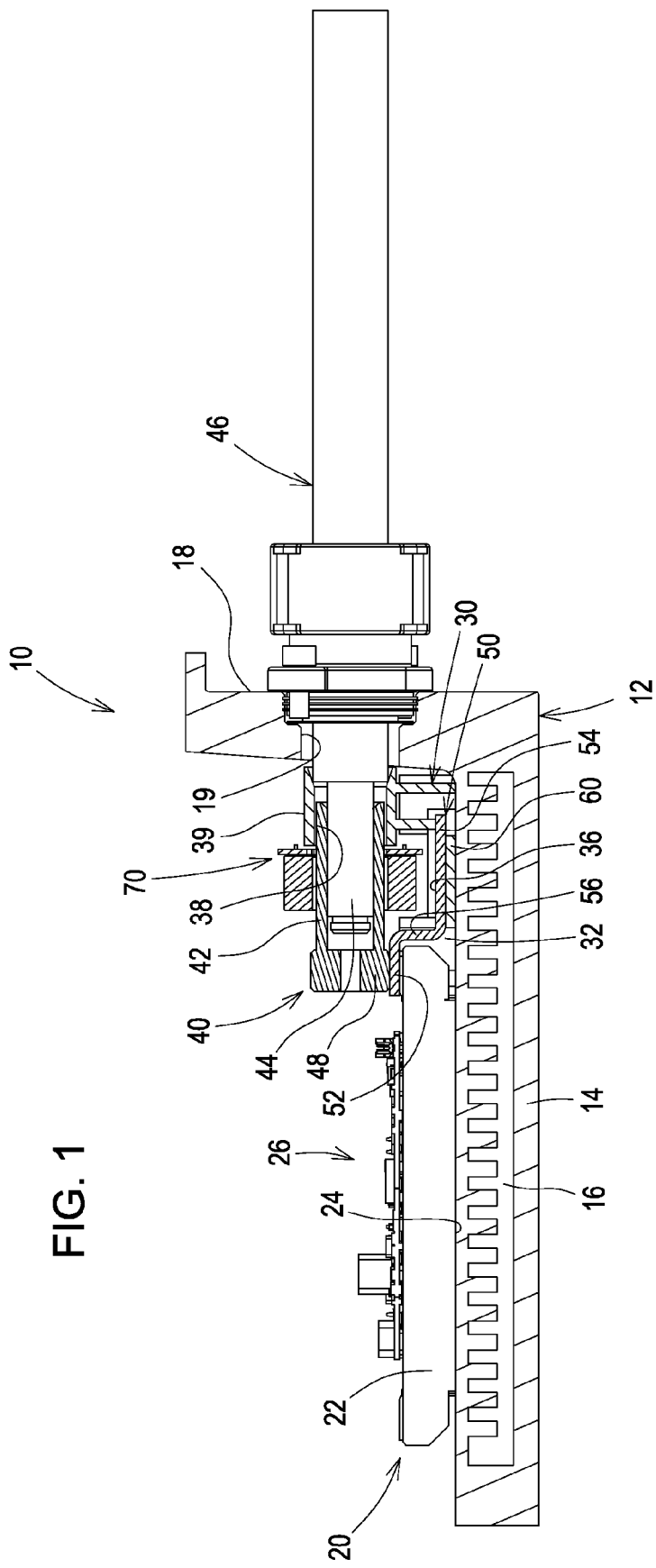
FIG. 1 is a sectional view of an electrical connection assembly embodying the invention.
Figure 2:
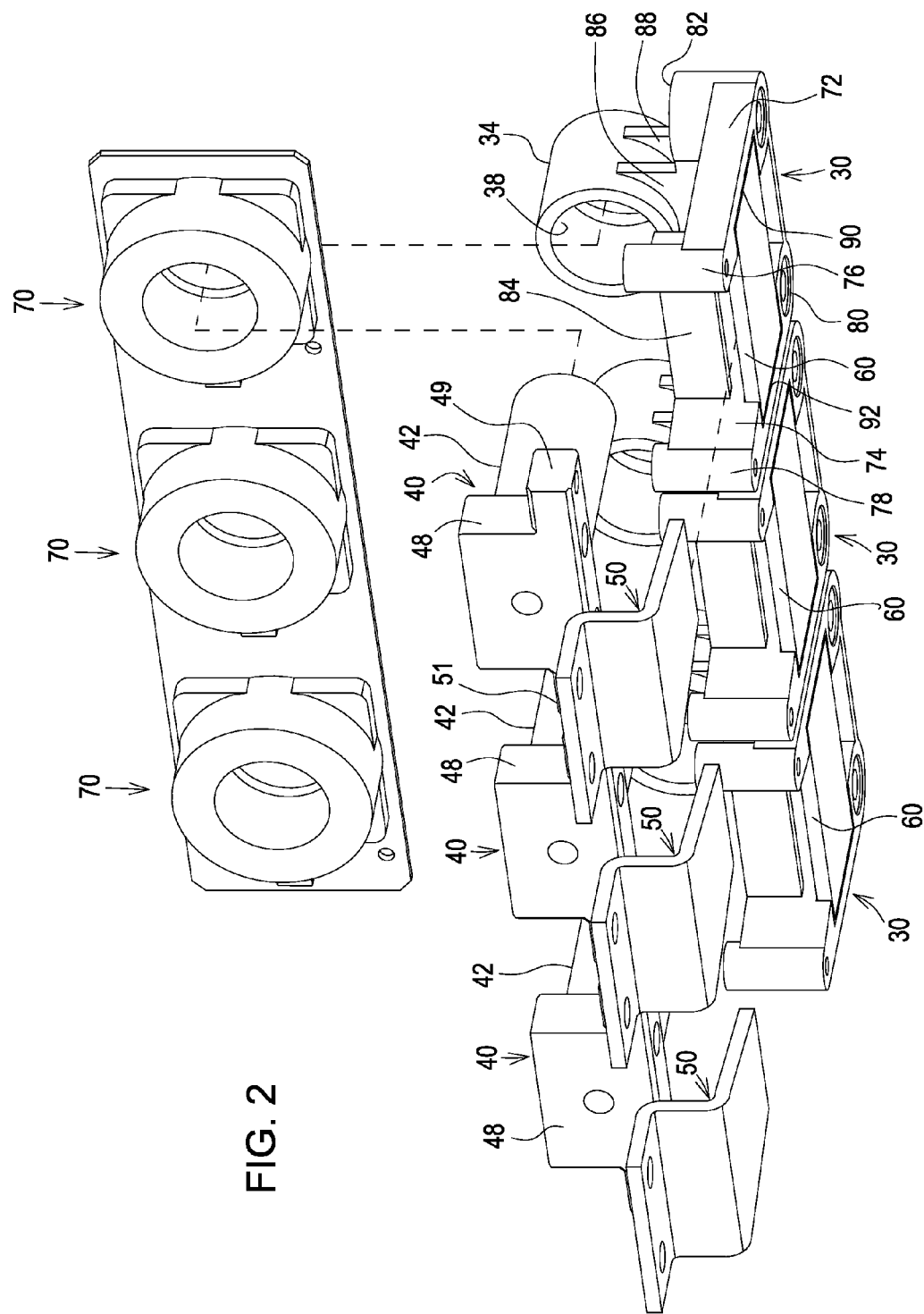
FIG. 2 is a perspective exploded view of a portion of FIG. 1.
Figure 3:
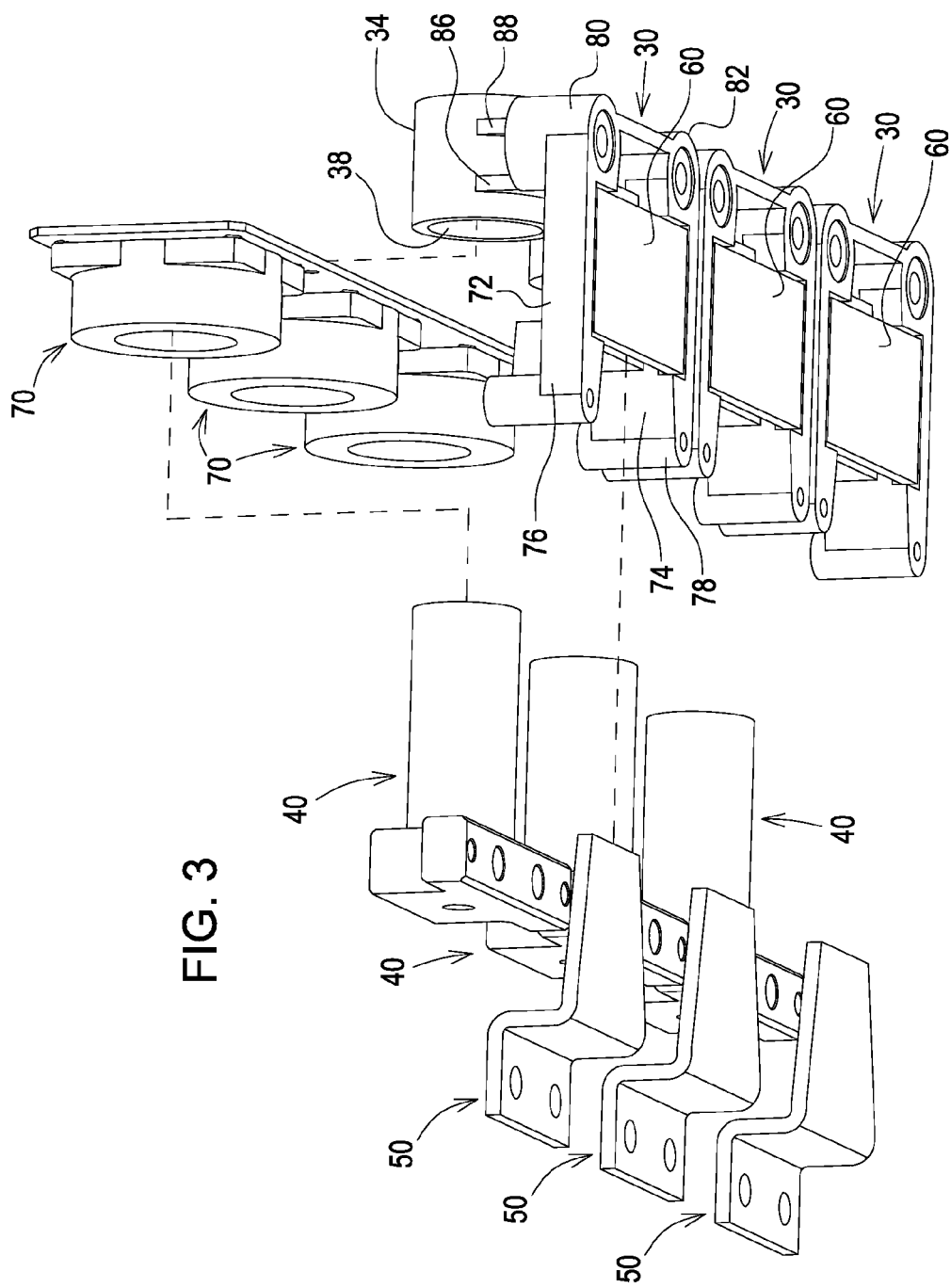
FIG. 3 is another perspective exploded view of a portion of FIG. 1.

Referring to FIGS. 1, 2 and 3, an electrical connection assembly 10 includes a metal housing 12. Housing 12 includes a lower part 14 which has cooling passages 16 formed therein and four side walls 18, of which only side wall 18 is shown. Side wall 18 has at least one opening 19 which receives an electrical cable 46. An electrical module 20, such as a power inverter, is supported on an upper surface of the lower part 14 of the housing 12. The module 20 is a conventional known part and has a plastic body 22 with a metal bottom surface 24 which conducts heat into the housing 12. The module 20 includes electrical components 26 mounted on a conventional circuit board 28. A cover 21 is sealingly attached to the top of the side wall 18 and protects the module 20 from the environment.

A plastic support 30 is mounted on the housing 12 between the module 20 and the side wall 18. Support 30 includes a lower part 32 and an upper part 34. Lower part 32 has an upwardly opening recess 36 formed therein. Upper part 34 is hollow and has a bore 38 extending therethrough.

The assembly 10 also includes a metal, preferably copper, female socket member 40. Socket member or connector 40 includes a hollow cylindrical part 42 which is adapted to receive the male pin 44 of an electrical or power cable 46. Socket member 40 also includes an end part 48 which is positioned over an end portion of the module 20. End part 48 has a pair of tabs 49 and 51. Each tab 49 and 51 has a bore so that the socket member 40 can be securely bolted to the module 20 with the upper end 52 of the heat sink 50 firmly in thermal contact with the end part 48. The cable 46 may be a high voltage cable. Cable 46 is shielded and is securely clamped to the side wall 18 of housing 12 in a conventional manner. The socket 40 conducts electricity from the pin 44 to the module 20.

The assembly 10 also includes a metal, preferably copper, heat sink 50. Heat sink 50 is has a generally reverse S-shaped cross-sectional shape. Heat sink 50 includes a horizontal first or upper end 52 which is positioned between the end part 48 of socket member 40 and an upper surface of module 20. Heat sink 50 also includes a horizontal second or lower end 54 which is positioned above and close to an upper surface of housing 12. Ends 52 and 54 are connected to each other by a central portion 56 which is oriented at right angles with respect to the ends 52 and 54. The heat sink 50 is connected directly to the socket member 40 of the power cable 46.

The assembly 10 also includes an electrically insulating heat conducting thermal pad 60 which is placed between the bottom surface of the end part 48 of socket member 40 and an upper surface of the lower part 14 of housing 12. Pad 60 conducts heat from heat sink 50 to the housing 12.

The assembly 10 also includes a conventional current sensor 70. Current sensor 70 is a hollow annular member which receives the socket member 40 and the pin 44. Such a current sensor is commercially available from LEM. The lower end of sensor 70 is received by the recess 36.

The result is an assembly 10 in which a high voltage cable is attached to a power inverter. The assembly 10 or connection system is environmentally sealed, electromagnetically shielded, more compact than existing solutions, and provides protection to susceptible electronic components in the inverter from damage during the installation process.

As best seen in FIGS. 2 and 3, the assembly 10 includes a plurality of support 30, sockets 40, heat sinks 50 and pads 60. Each support 30 includes a pair of side members 72 and 74, mounting bosses 76, 78, 80 and 82 and a cross plate 84 which connects between the side members 72 and 74. Each support 30 also includes a pair of support plates 86 and 88 which support the hollow cylindrical upper part 34. The pad 60 is received by recesses 90 and 92 which are formed in the side members 72 and 74, respectively. The lower end 54 of the heat sink 50 is received between cross plate 84 and the pad 60.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

We claim:

1. An electrical assembly, comprising:
a metal housing having a lower part and a side wall;
a component base mounted on the lower part of the housing and having an end part which is spaced apart from the side wall;
an electrical module having a plurality of electrical components mounted on the component base;
a socket for conducting electrical current to the electrical components, the socket extending through the side wall, the end part of the component base being positioned between the lower part and an end portion of the socket;
a heat sink member for conducting heat from the socket to the metal housing lower part, the heat sink member having a first end positioned between the end portion of the socket and the end part of the base, and having a second end positioned between the end part of the base and the side wall;
an electrically insulating thermally conducting pad positioned between the housing lower part and the second end of the heat sink member;
a support member positioned between the end part of the base and the side wall, the support member having a base mounted to the housing lower part and having a hollow part which receives a portion of the socket; and
a current sensor, the current sensor having a body which surrounds a portion of the socket.

2. The electrical connection assembly of claim 1, wherein: the connector comprises a hollow socket.

3. The electrical connection assembly of claim 1, wherein: the electrical module comprises a power inverter.

4. The electrical connection assembly of claim 1, wherein: the support member hollow part is positioned between the current sensor and the side wall.

5. The electrical connection assembly of claim 1, wherein: the support member forming a recess which receives a portion of the current sensor.

\* \* \* \* \*